United States Patent
Kartal

(10) Patent No.: US 9,136,199 B2
(45) Date of Patent: Sep. 15, 2015

(54) MONITORING AND CONTROLLING TEMPERATURES IN A SEMICONDUCTOR STRUCTURE

(71) Applicant: Infineon Technologies AG, Neubiberg (DE)

(72) Inventor: Veli Kartal, Munich (DE)

(73) Assignee: Infineon Technologies AG, Neubiberg (DE)

( * ) Notice: Subject to any disclaimer, the term of this patent is extended or adjusted under 35 U.S.C. 154(b) by 118 days.

(21) Appl. No.: 13/952,424

(22) Filed: Jul. 26, 2013

(65) Prior Publication Data
US 2015/0028337 A1    Jan. 29, 2015

(51) Int. Cl.
*H01L 23/34* (2006.01)
*H01L 27/02* (2006.01)

(52) U.S. Cl.
CPC ............ *H01L 23/34* (2013.01); *H01L 27/0255* (2013.01)

(58) Field of Classification Search
CPC ...................................................... H01L 22/34
See application file for complete search history.

(56) References Cited

U.S. PATENT DOCUMENTS

| | | | |
|---|---|---|---|
| 2006/0066384 A1* | 3/2006 | Jain et al. | 327/378 |
| 2011/0073668 A1* | 3/2011 | Garber | 236/101 R |
| 2011/0080207 A1* | 4/2011 | Ball | 327/512 |
| 2011/0156799 A1* | 6/2011 | Zanardi et al. | 327/512 |
| 2011/0157756 A1* | 6/2011 | Zanardi et al. | 361/94 |
| 2011/0298528 A1* | 12/2011 | Endo et al. | 327/512 |
| 2011/0316606 A1* | 12/2011 | Ladurner et al. | 327/378 |
| 2013/0027830 A1* | 1/2013 | Illing | 361/103 |

* cited by examiner

*Primary Examiner* — Lex Malsawma
(74) *Attorney, Agent, or Firm* — Slater & Matsil, L.L.P.

(57) ABSTRACT

An electronic device includes a semiconductor structure. A first temperature sensor is located at a hot spot of the semiconductor structure and a second temperature sensor is located at a cold spot of the semiconductor structure. A control block is configured to control current flow through the semiconductor structure. For example, the control block is configured to cut off the current flow through the semiconductor structure when a temperature at the hot spot exceeds a first predefined threshold or when a temperature difference between the temperature at the hot spot and a temperature at the cold spot exceeds a second predefined threshold.

22 Claims, 4 Drawing Sheets

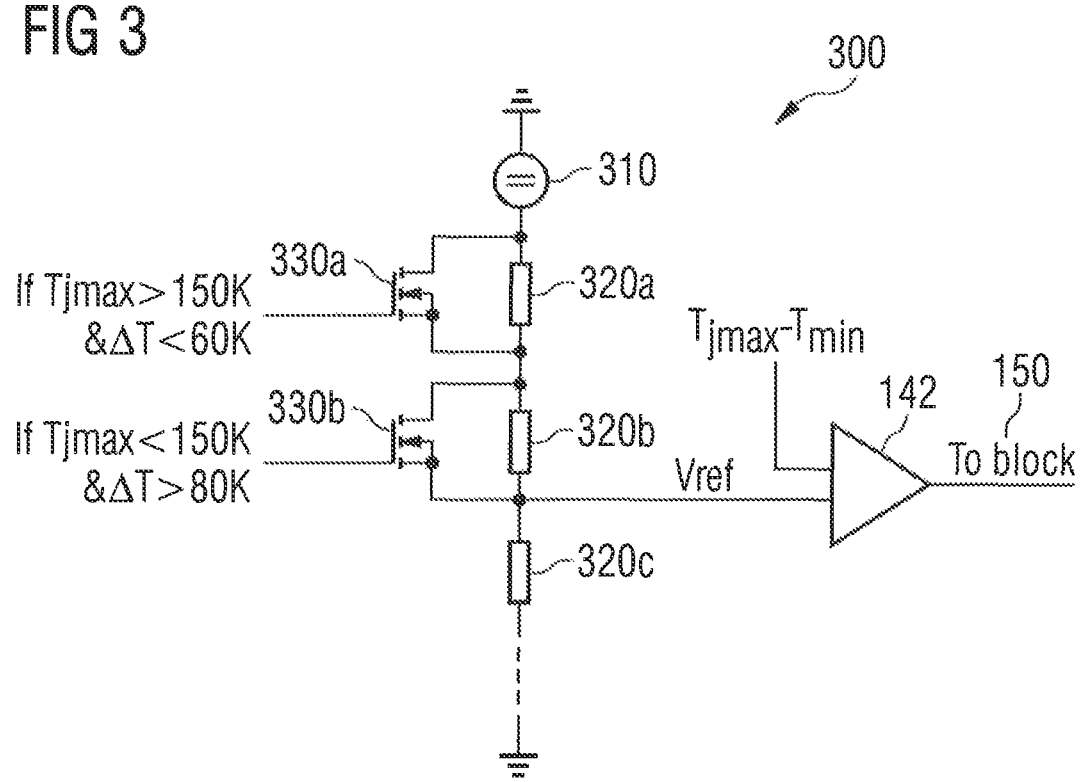

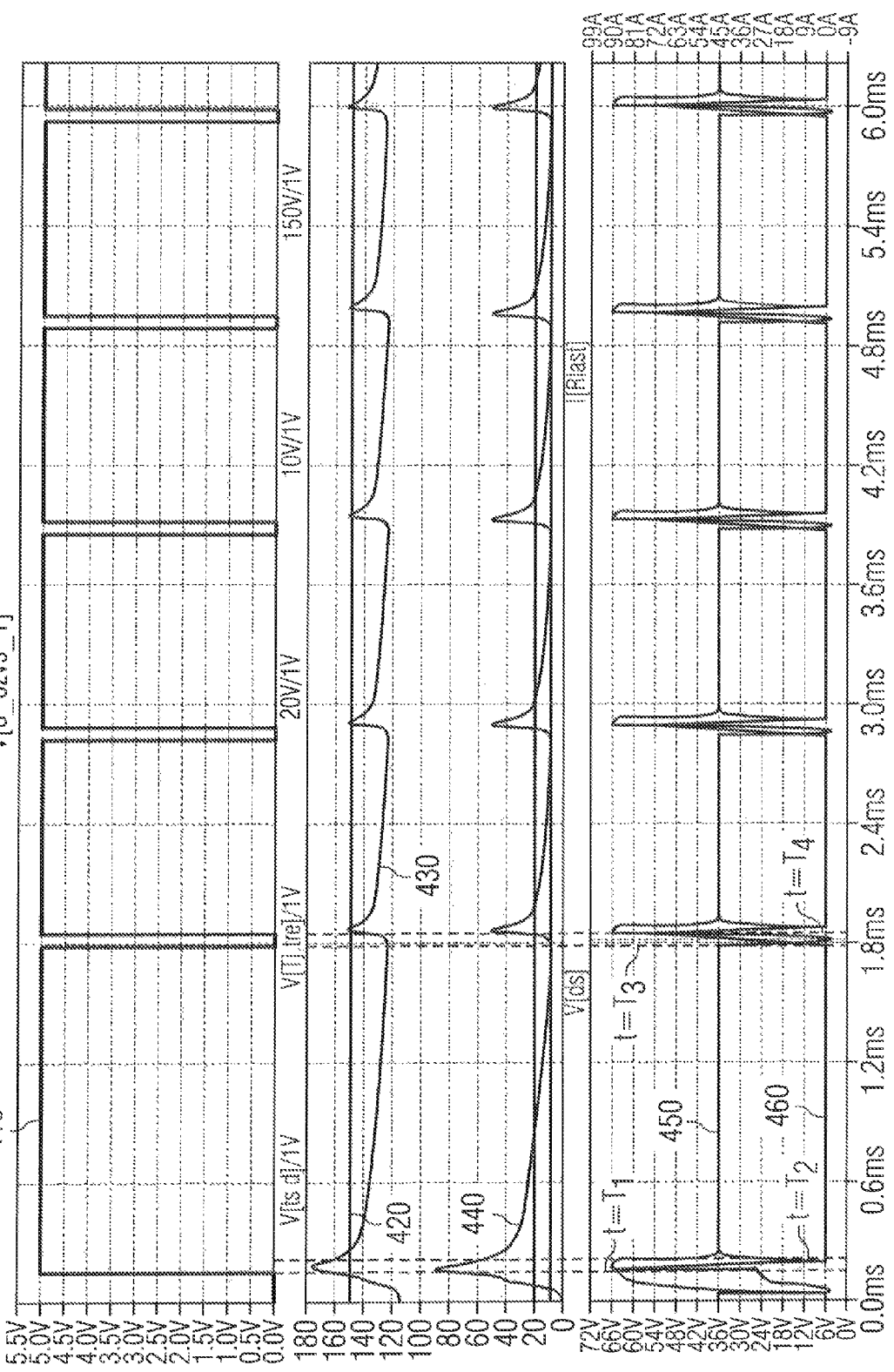

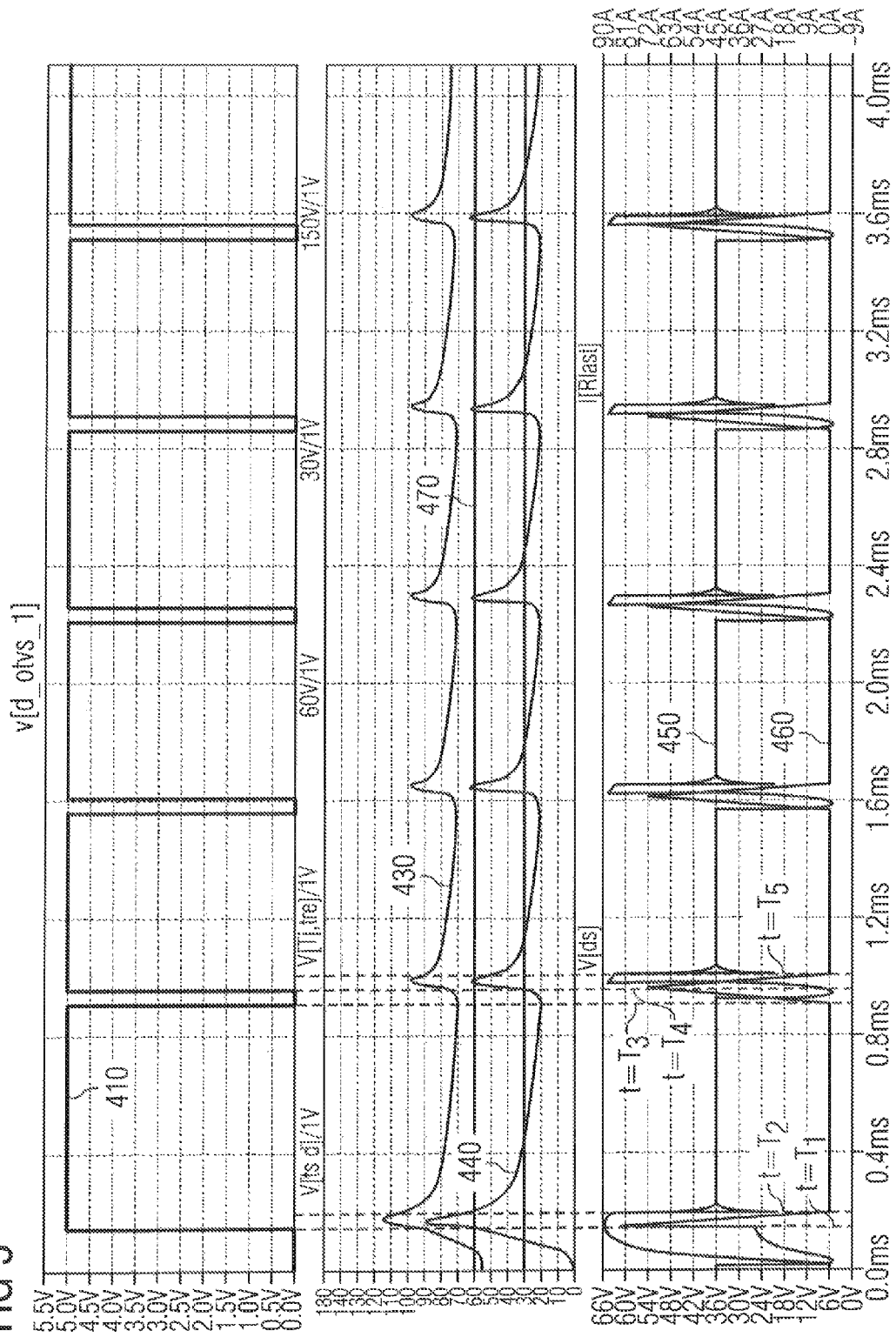

MONITORING AND CONTROLLING TEMPERATURES IN A SEMICONDUCTOR STRUCTURE

TECHNICAL FIELD

The present invention relates generally to components and, in particular embodiments, to monitoring and controlling temperatures in semiconductor structures.

BACKGROUND

Semiconductor devices generally generate heat whenever a high power is applied to the semiconductor since each semiconductor device exhibits an ohmic resistance that burns some electrical power into heat. As is known a semiconductor device may be damaged by high temperatures, since for example the silicon will exhibit so-called thermal exhaustion symptoms, e.g., metallization of the silicon. Accordingly, the temperature of a semiconductor structure should not exceed a predefined limit to prevent such damage.

To limit the temperature of a semiconductor structure the current flow through the structure can be shut down in case a predefined temperature limit is exceeded. In conventional chips or integrated circuits the temperature is measured at the estimated hottest and at the estimated coldest spot. Besides evaluating the measured temperatures directly to prevent overheating the measured temperatures can be compared to get the temperature difference as a second clue of the actual thermal stress of the semiconductor structures comprised in chip or integrated circuit.

In operation there are some situations prone to cause overheating of a semiconductor, particularly when large currents flow through the semiconductor. In one example a controller for controlling power supply for an electric motor or another load may experience large currents, for example, upon powering-on, i.e., the so-called inrush current peak. Furthermore, large currents may occur in case of a short-cut at the load. As a conventional means for limiting the generation of heat within the semiconductor a current limiter can be used for limiting the current while at simultaneously monitoring the temperature of the semiconductor. In case the measured temperatures indicate an overheat situation the corresponding chip or at least the semiconductor structure comprised therein that caused the situation is switched off to prevent any damage until the chip has cooled down. Thereafter, i.e., as soon as the temperatures have dropped below a predefined threshold, the semiconductor may be put into normal operation again. So whenever the measured temperatures indicate an overheat situation, the semiconductor is switched off for cooling down until being put into normal operation again. In this way the chip or integrated circuit may be operated in cycles of a loop. However, in case of a load having inductive characteristics, the process of switching-off the current flow does not instantly cut off the current flow. As a consequence the semiconductor may be further heated, which may cause damages of the semiconductor structure.

SUMMARY OF THE INVENTION

The invention describes semiconductor devices and corresponding methods for solving at least the above mentioned problems.

The invention proposes an electronic semiconductor device comprising at least one semiconductor structure. The device further comprises means for determining the temperature at the coldest and at the hottest spot of a semiconductor device. The determined coldest and hottest temperatures are provided to a means for determining the difference between the two temperatures. The means may provide the determined difference to a control means for controlling the semiconductor device. The control means determines whether the determined temperature difference exceeds a predefined first maximum value and whether the hottest temperature exceeds a second predetermined threshold value and also controls the current flow through the semiconductor device in order to cut off the current flow in these cases.

BRIEF DESCRIPTION OF THE DRAWINGS

The present invention will be understood more fully from the detailed description given below and from the accompanying drawings of the invention, which, however, should not be taken to limit the invention to the specific embodiments, but are for explanation and understanding only and wherein:

FIG. 3 depicts a circuit for temperature evaluation;

FIG. 4 depicts signals in the semiconductor device when operating the device for limiting the absolute temperature of a semiconductor structure; and FIG. 5 depicts signals in the semiconductor device when operating the device for limiting the temperature across the semiconductor structure.

DETAILED DESCRIPTION OF ILLUSTRATIVE EMBODIMENTS

Figure 1:
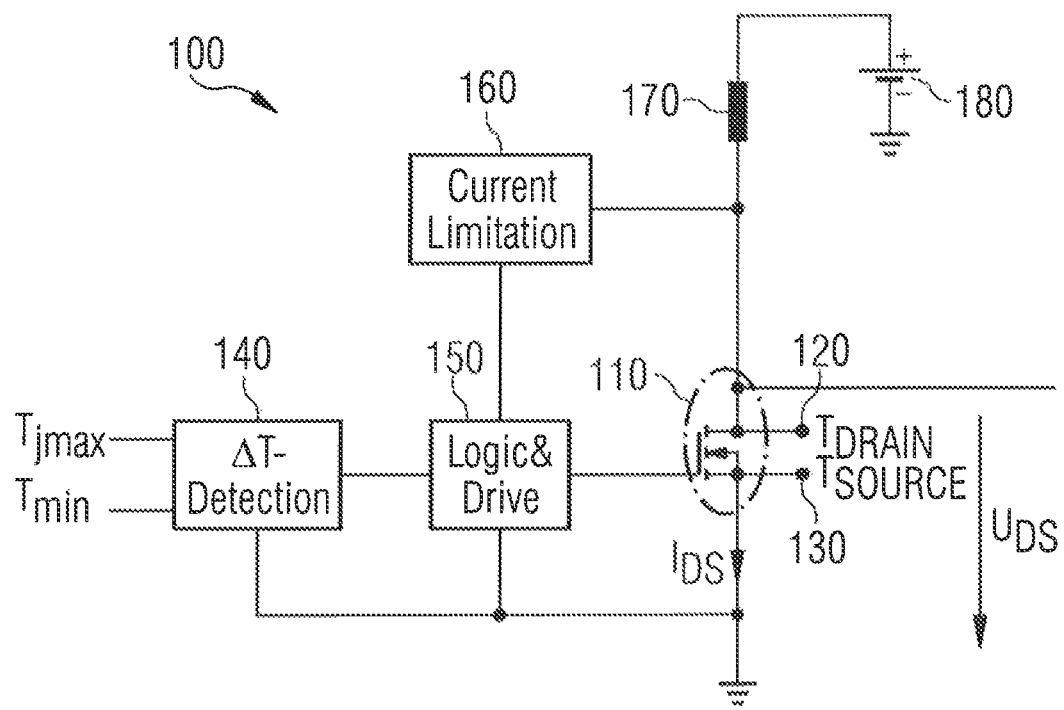
FIG. 1 depicts a block diagram of an electronic semiconductor device coupled to a load.

FIG. 1 depicts a block diagram of an electronic semiconductor device 100 comprising a semiconductor structure 110 and at least a first means for determining the highest temperature of the device and another means for determining the lowest temperature of the device. Note that the temperature determining devices shall be located at the probably hottest spot and the probably coldest spot on the device. Typically, the hottest spot of the semiconductor device 100 is around the area exhibiting the highest power density, whereas the lowest spot may at a location exhibiting a small or negligible power density. Accordingly, the hottest spot may be located close to a bond wire serving as a power supply of the device. In the depicted embodiment the temperature determining devices are exemplified by element 120 and element 130, since the exemplifying circuit comprises only this semiconductor structure for demonstration purposes. Note that these locations shall not limit the placing of the temperature determining circuits on the device, but shall demonstrate two arbitrary locations.

Furthermore, device 100 comprises a circuit 140 for determining the temperature difference between the measured semiconductor structure temperatures, i.e., the hottest and lowest detected temperature, a logic and drive circuit 150 for controlling the semiconductor structure 110, an optional current limitation circuit 160 for limiting the amplitude of a current flow $I_{DS}$ through the semiconductor structure 110.

In operation the electronic semiconductor device 100 is coupled to an electric load 170, which in turn may be coupled to an electric supply 180. Though load 170 is shown as an inductor, the load may have any characteristic. That is, load 170 may have characteristics of an inductor or of an ohmic resistance or of a capacitor or a mixture thereof. Accordingly, the characteristics of load 170 are not intended to limit the scope of the invention.

The term electronic semiconductor device in the context of this description shall denote an electronic device comprising at least one semiconductor structure 110. The electronic semiconductor device may be implemented as a so-called system-on-chip or may be implemented using discrete components arranged on one or more printed circuit boards, i.e., the invention shall not be limited in this regard.

In one embodiment semiconductor structure 110 may be any kind of semiconductor structure comprising a semiconductor junction. Thus the semiconductor structure may be a transistor or a thyristor or an insulated-gate bipolar transistor (IGBT), particularly for controlling a current flowing through the semiconductor structure. Though the semiconductor structure depicts a MOSFET, the scope of the invention shall not be limited to that embodiment. Note that in one particular embodiment the semiconductor structure may be a so-called power MOSFET as typically used in power supplies or power controls for switching large currents, for example, in a power supply powering an electric motor or other devices used in automotive appliances.

Note that the application of the disclosed invention shall not be limited exclusively to so-called power electronics for controlling comparatively large voltages and/or currents. Instead, the described invention may be applied to any arbitrary semiconductor device that controls a power supply, even if the controlled power is comparatively low.

As mentioned above semiconductor structure 110 may generate heat whenever a current flows through structure, i.e., when there is a drain-source current $I_{DS}$ flowing through the semiconductor structure 110. As a consequence structure 110 may be damaged in case the junction temperature of the semiconductor structure exceeds a predefined absolute temperature or when the temperature difference across the semiconductor structure exceeds a predefined threshold.

In order to alleviate the risk of damaging the structure by temperature, the device 100 comprises a device 120 configured to determine the temperature at the hottest spot of the device 110, and a device 130 configured to determine the temperature at the coldest spot of device 100.

The components 120 and 130 for determining a temperature may be implemented using conventional means. In one example, a means for determining a temperature, or more exactly for producing an electrical signal reflecting a temperature at a particular location, may comprise a constant current source, which ideally is temperature independent, and a diode exhibiting an ohmic resistance depending on temperature. The current source may provide a small current through the diode that in turn provides a voltage reflecting the actual temperature of the diode. Since the diode is located at the point of interest, i.e., at the source or drain of the semiconductor structure 110, the resistivity of the diode reflects the temperature of the drain or source of structure 110 respectively. Note that above described implementations for elements (or circuits) 120, 130 serve as exemplifying embodiments only, i.e., different implementations are comprised within the scope of the invention.

Figure 2:
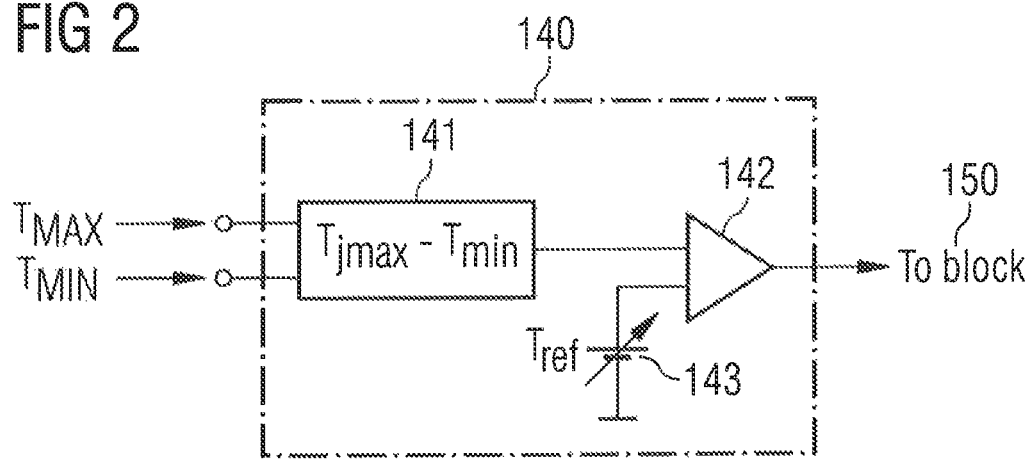
FIG. 2 depicts a schematic sketch of a temperature detection block.

The output signal of temperature determining device 120, are coupled to ΔT-detection block 140. FIG. 2 depicts a more detailed diagram of block 140.

As depicted in FIG. 2, ΔT-detection block 140 receives the signals from temperature determining components 120 and 130. Block 140 evaluates the temperature signals reflecting the temperature across structure 110 considering two criteria regarding thermal stress of semiconductor structure 110 and provides a signal to logic and drive block 150 indicating the outcome of checking the criteria.

One criterion regarding thermal stress of a semiconductor structure is the temperature difference ΔT across the structure, i.e., the temperatures of the hottest and coldest spot of the device. Since semiconductor structure 110 may be damaged by a too high temperature, a corresponding threshold value may be defined. Block 140, which receives the temperature signals reflecting the temperature across structure 110, determines the ΔT between the temperatures and outputs a corresponding signal, i.e., a signal indicating ΔT across structure 110.

Another criterion regarding thermal stress is the absolute temperature of the structure, which typically occurs at a semiconductor junction of the depicted transistor. Hence, the temperature $T_{jmax}$ not necessarily but in many cases typically is the highest temperature of semiconductor structure 110.

The ΔT-signal as determined by block 141 is provided to comparator block 142 as one input signal. The second input signal to comparator block 142 is a reference signal 143 reflecting two conditions that shall be adhered to:

the temperature difference across the semiconductor structure, i.e., the temperature difference across the structure shall not exceed a first predefined threshold value, and the highest temperature of the monitored semiconductor structure shall not exceed a second predefined maximum threshold value.

The reference signal in this does not reflect one predefined threshold temperature but is adapted in case either of the two criteria is transgressed.

In one exemplary embodiment the first predefined threshold value, i.e., the maximum allowable temperature difference across the semiconductor device is set to a value of 60K and the second predefined maximum value is set to 150° C. If it is detected that either of the two values is reached or exceeded the reference temperature signal 143 is reduced in order to initiate a reduction of the current amplitude flowing through structure 110, wherein the reduction can be accomplished by shutting off structure 110 and/or by reducing the current amplitude via current limiter 160.

Referring again to FIG. 1, comparator block 142 in this way provides a signal to logic and drive block 150 indicating that at least one of the above described thermal stress criteria has been detected by block 140.

Note that in one embodiment reference signal 143 can be implemented as a voltage as indicated by the variable voltage source depicted in the Figure. However, the reference signal alternatively can be implemented as a current, the invention shall not be limited in this regard.

Logic and drive block 150 is communicatively coupled to ΔT detection block 140 on one side to receive input data. Logic and drive block 150 furthermore may be communicatively coupled to semiconductor structure 110 for controlling the structure, i.e., in the case structure 110 is a transistor block 150 may be coupled to the gate for controlling conductivity of the structure. By switching the conductivity of the structure to non-conducting, i.e., switching the transistor to its off-state, the current flow through the structure can be shut off thus reducing or shutting off the heat generation caused by the current flow through the structure. In case the semiconductor structure is a transistor, this can be achieved by controlling the voltage applied to the gate of the transistor. Accordingly, when the signal provided by block 140 indicates that the predefined thresholds have been reached or exceeded, logic and drive block 150 may control the current flow through structure 110 in order to reduce heat generation thus preventing thermal damage from structure 110.

Logic and drive block 150 furthermore can be communicatively coupled to an optional current limitation block 160.

As indicated by the connecting line from block 160 to the electrical line between load 170 and semiconductor structure 110, block 160 may control, i.e., particularly reduce, the amplitude of the current flowing through semiconductor structure. In case the semiconductor structure itself allows control of its conductivity, block 160 may serve as an additional means for controlling the amplitude of the current flowing through structure 110 itself. Alternatively, particularly in embodiments where the conductivity of semiconductor structure 110 cannot or shall not be controlled for reducing the amplitude of the current flowing there through, block 160 may serve as the only current limiter for controlling the current amplitude.

In operation the temperatures of the device, i.e., in the exemplifying example across the semiconductor structure, are monitored permanently in order to survey the thermal stress posed on the structure. Since the temperature sensing elements 120 and 130 are located at the probably hottest and coldest spot respectively the thermal monitoring is fast and accurate. Accordingly, any temperature variation of the monitored semiconductor device is detected and can be processed by the processing blocks.

FIG. 3 depicts an exemplary embodiment of a circuit 300 for implementing $\Delta T$ detection block 140 wherein the generation of a reference voltage $V_{ref}$ is illustrated. A series of ohmic resistors is coupled to temperature independent voltage source 310. The series of resistors comprises resistors 320a, 320b and 320c. Resistor 320a can be bridged by switch 330a and resistor 320b can be bridged by switch 330b respectively in case these are controlled to their on state, i.e., conducting. Resistor 320c serves as a current limiter in case both resistors 320a and 320b are bridged by their associated switches 330a and 330b.

As indicated in the Figure switch 330a is controlled by a signal indicating whether the determined absolute temperature exceeds the predefined threshold while at the same time the determined temperature difference $\Delta T$ is below 60K, wherein the value of 60K is considered as another predefined threshold value. Accordingly, switch 330a is set to its on state, i.e., conducting thus bridging resistor 320a if the predefined threshold value of 150K is exceeded while the determined temperature difference is below the predefined value of 60K. Similarly, switch 330b is controlled to its on state if the absolute temperature is determined to not exceed the predefined threshold value while at the same time the determined temperature difference $\Delta T$ does exceed the predefined threshold value of 80K.

As mentioned above comparator 142 at its one input takes a signal reflecting the determined temperature difference value $\Delta T$ and takes signal $V_{ref}$ as second input, wherein $V_{ref}$ is controlled by bridging resistors 320a and 320b as described above. As is apparent voltage $V_{ref}$ decreases stepwise if switches 330a, 330b do not bridge, i.e., shortcut, resistors 320a and/or 320a, so that a current flow through resistors 320a, 320b affect a voltage decrease of $V_{ref}$. In this way $V_{ref}$ can be controlled depending on the determined absolute temperature and the determined temperature difference $\Delta T$.

Note that switches 330a and 330b respectively may be arbitrary implementations of switches. In one embodiment these switches may be implemented as MOSFETs. Furthermore, the control signal applied to the switches may be generated arbitrarily as is apparent to a person skilled in the art. In one embodiment the signals may be generated using analog circuitry comprising bandgap references. Alternatively, the determined temperature signals may be digitized, converted from analog to digital, and may be processed in any arbitrary digital signal processor (DSP) that may evaluate and provide control signals for switches 330a and 330b.

FIG. 4 depicts the outcome of a simulation of the operation of semiconductor device 100 wherein the reference signal is adapted that a second predefined threshold value of 150° C. representing the maximum allowed absolute temperature at structure 110 is not exceeded. The second threshold of 150° C. is depicted in the Figure by line 420. A power-MOSFET is assumed as the semiconductor structure 110, so the highest temperature is expected at the junction located at the drain of the MOSFET. Therefore, the curve of the highest temperature of structure 110 is that of the drain of the MOSFET.

Note that in all graphs of FIG. 4 the x-axis shows time t in ms and the y-axis shows the signal amplitude in Volts V and Ampere respectively. In FIG. 4 signal V[d_ot, vs_1] 410 reflects the output signal of $\Delta T$ detection block 140, wherein an amplitude of 5V, i.e., logic high, indicates that at least one of the two threshold values has been reached or exceeded. We assume that the output signal of block 140 is used by block 150 to switch off the current through structure 110 without further interpretation of the signal. Accordingly, when signal 410 is high, the current through structure 110 is shut off. Conversely, the current through structure 110 is allowed to flow while signal 410 is zero.

Further we assume that at the beginning of the simulation, i.e., at t=0, the highest temperature of semiconductor structure 110 starts with a temperature of roughly 115° C. and a reference temperature signal of 0K. Note that in the Figure the highest temperature of structure 110 is depicted by signal 430 and the temperature difference signal as provided by block 141 is depicted as signal 440. The temperature reference signal 143 is not depicted in FIG. 4.

Furthermore, we assume that at t=0 the MOSFET is switched to its conducting state, i.e., a current flow is enabled by an appropriate voltage applied to the gate of the MOSFET. As a consequence to switching the MOSFET to its on-state, the drain-source voltage as indicated by signal 450 drops to zero while at the same time there is an inrush current, confer signal 460, through the MOSFET.

Due to the high amplitude of the inrush current through structure 110, the highest temperature 430 of the structure 110 rises. As soon as the corresponding threshold value is reached, i.e., the second defined temperature threshold value is reached at 150° C., $\Delta T$-detection block 140 outputs signal 410 indicating that a temperature threshold has been reached. As mentioned above the high state of signal 410 triggers logic and drive block 150 to cut off the current flow through structure 110, i.e., the power MOSFET, at $t=T_1$. Note that current limiter 150 can be used to cut off the current flow in addition to switching the MOSFET to its off state.

Due to the inductive characteristic of the load coupled to device 100 and to switching off the transistor, the drain-source voltage across structure 110 experiences a short peak after switching the current off and before settling at $t=T_2$ to the expected voltage of the settled off-state. Further, also due to the inductive characteristic of load 170, the current flow $I_{DS}$ through the structure does not drop down instantly to zero when switching the MOSFET off at $t=T_1$. Instead the current flow continuously falls to zero during time $T_2-T_1$. As a consequence of the ongoing current flow through the structure until $t=T_2$ the maximum temperature of the structure still increases to a temperature at around 170° C., i.e., higher than the predefined threshold value.

Since the current flow through structure 110 stopped at $t=T_2$, the maximum temperature of structure 110 falls until $t=T_3$, at which time the current flow through structure 110 is enabled again, i.e., the exemplifying MOSFET is switched to its on-state again by logic and drive block 150 that passes through signal 410 of block 140. According to enabling the current flow, drain-source voltage 450 drops to zero and current 460 increases until the current flow is disabled at $t=T_4$. Note that reference temperature signal 440 at this switch-off action exhibits a significantly lower temperature that at the first switch-off action at $t=T_2$, i.e., if the maximum temperature in a cut-off action is exceeded then reference temperature signal 143 is reduced for the subsequent cut-off action. Accordingly, i.e., since the reference temperature signal 440 has been set to a smaller value of roughly 55K in the meantime, the current flow through structure 110 is cut off earlier. Note that the time span $T_4-T_3$ is significantly shorter in time that $T_2-T_1$. This time the action of cutting the current off prevented the maximum temperature at the structure to exceed the predefined threshold of 150° C., since the reference temperature signal has been adapted according to the previous cut-off action, in other words the increase in temperature after cutting of the current flow at $t=T_1$ has been taken in to account by reducing reference temperature signal 143 dynamically. Again, as soon as the current flow has dropped to zero, semiconductor structure begins to cool down.

When the maximum temperature has fallen to an extent that allows switching the MOSFET on, i.e., allowing a current flow through structure 110, the MOSFET is switched to its on-state again. As mentioned above the action of enabling current flow through the structure can be performed controlling the structure itself and/or by controlling current limiter 160. As depicted in FIG. 4 the cycle of allowing a current flow through semiconductor structure 110 can be repeated thus enabling current control while at the same time preventing thermal damage from structure 110 by dynamically adapting reference temperature signal 143.

While FIG. 4 illustrates operation of the device and adapting the reference temperature signal 143 in order to keep the maximum temperature below the second defined threshold value, i.e., to keep the maximum temperature of semiconductor structure below 150° C. FIG. 4 illustrates the signals when operating the device to keep the temperature difference $\Delta T$ between the source and drain of the monitored structure 110 below a first previously defined threshold value. As in the example of FIG. 4, we assume the load 170 to exhibit inductive characteristics and the semiconductor structure 110 as a MOSFET.

The temperature of interest in FIG. 5 is the temperature difference 440 across the semiconductor structure 110, i.e., $\Delta T$ across the MOSFET. As illustrated by line 470 the first predefined threshold value is set to 60K as illustrated by line 470. The temperature decline across structure 110, i.e., across the MOSFET, thus shall not exceed 60K.

Similarly, as noted above with regard to FIG. 4, a current flow through structure 110 is enabled at $t=0$, i.e., at $t=0$ an appropriate gate voltage is applied to the gate of the MOSFET by logic and drive block 150. As a consequence the drain-source voltage 450 drops to zero while at the same time there is an inrush current through the MOSFET, confer signal 460. The high amplitude of the inrush current through the MOSFET causes an increase in the $\Delta T$ temperature across the structure as illustrated by 440.

At $t=T_1$ temperature difference $\Delta T$ it is detected that the predefined threshold value is exceeded. $\Delta T$ detection block 140 correspondingly outputs a signal to logic and drive block 150 that in turn triggers to cut off the current flow through the MOSFET. However, as already mentioned above, due to the inductive characteristic of load 170, the current flow does not instantly drop to zero amplitude when switching the MOSFET to its non-conducting state but decreases until reaching zero at $t=T_2$. Similarly, as noted above with regard to FIG. 4, the drain-source voltage does no instantly and straight jump to the voltage as expected, but exhibits a voltage peak until settling. Caused by the current flow during $T_2-T_1$, the temperature difference across the MOSFET further increases during $T_2-T_1$ as indicated 440, wherein the temperature difference exceeds the predefined threshold value.

Since the current flow stops at $t=T_2$, the generated heat within the MOSFET spreads from the hot to the less hot areas thus reducing the temperature difference $\Delta T$ 440 across the MOSFET. Further, though of minor interest here, the absolute temperature 430 of the structure falls.

When the structure has cooled down sufficiently, the current flow through the MOSFET can be allowed again by switching the MOSFET to its conducting state and, if adequate, by controlling current limiter 160 to allow a current through the MOSFET. Here, in the depicted exemplifying embodiment, the current through the MOSFET is allowed at $t=T_3$, i.e., when the temperature difference $\Delta T$ has dropped to roughly 20K.

When the MOSFET is switched to its on-state, confer signal 410, i.e., a current flow $I_{DS}$ is enabled, the drain-source voltage 450 drops and a corresponding inrush current flow 460 can be observed. The inrush current again causes heat generation in the MOSFET, thus temperature difference $\Delta T$ increases again, confer signal 440.

While the current flow through the MOSFET generates heat and increases heat, the temperatures determined by elements 120 and 130, which are located at MOSFET, are constantly measured and the temperature difference is monitored and compared to temperature reference signal 143. Since the temperature reference signal has been reduced, the signal output by $\Delta T$ detection block 140, i.e., signal 410 in FIG. 5, indicates to cut off the current earlier than in the initial switching cycle. As a consequence, the increase in temperature difference $\Delta T$ is less than before and does not significantly exceed the predefined threshold value even though the current flow through the MOSFET slowly drops to zero after $t=T_4$ until it reaches zero at $t=T_5$. Note that the temperature reference signal provided by source 143 has been reduced after the first switching cycle $t=0-t=T_2$, since the predefined threshold value for temperature difference $\Delta T$ was exceeded in that cycle after cutting off the current flow. Accordingly, if it is detected that a predefined temperature threshold is exceeded in the course of cutting off the current flow through structure, reference temperature signal 143 may be adapted, i.e., may be reduced to trigger the cut-off action earlier. Note that signal 143 may be adapted if either of the two temperature limits, i.e., the absolute maximum temperature of the structure or the temperature difference $\Delta T$ across the structure is exceeded.

Similarly, reference temperature signal 143 can be adapted if the temperatures are well below the predefined threshold values in order to extend the current flow through the structure, i.e., reference temperature signal 143 may be reduced or increased dynamically during operation of device 100 based on the determination if either a temperature threshold is exceeded or in case the temperatures of the structures are significantly below the threshold values. In this way, operation of device 100 can be optimized by dynamically adapting reference temperature signal 143 during operation.

Whereas many alterations and modifications of the present invention will become apparent to a person of ordinary skill in the art after having read the foregoing description, it is to be understood that any particular embodiment shown and described by way of illustration is in no way intended to limit the scope of the claims which themselves recite only those features regarded as essential to the invention.

What is claimed is:

1. An electronic semiconductor device comprising:
   a semiconductor structure for power control;
   a first detector for determining a hot temperature at a hot spot of the semiconductor structure;
   a second detector for determining a cold temperature at a cold spot of the semiconductor structure;
   a subtractor for determining a temperature difference between the hot temperature and the cold temperature; and
   a controller for controlling current flow through the semiconductor structure, wherein the controller is configured to:
      generate a temperature reference signal,
      cut off the current flow through the semiconductor structure when a semiconductor structure temperature exceeds a first predefined threshold as indicated by a comparison with the temperature reference signal,
      cut off the current flow through the semiconductor structure when the temperature difference exceeds a second predefined threshold as indicated by a comparison with the temperature reference signal,
      adjust the temperature reference signal when the semiconductor structure temperature exceeds the first predefined threshold, and
      adjust the temperature reference signal when the temperature difference exceeds the second predefined threshold.

2. The electronic semiconductor device of claim 1, wherein the semiconductor structure comprises a transistor or a diode or an IGBT.

3. The electronic semiconductor device of claim 1, further comprising a current limiter for limiting the current flowing through the semiconductor structure.

4. The electronic semiconductor device of claim 3, wherein the controller comprises a logic and drive circuit communicatively coupled to the current limiter and coupled to the semiconductor structure for controlling the current flow through the semiconductor structure.

5. The electronic semiconductor device of claim 1 wherein the semiconductor structure comprises a power MOSFET.

6. The electronic semiconductor device of claim 1, the first detector, the second detector, and the subtractor operate when the device is controlled to switch off a load coupled to the semiconductor structure.

7. The electronic semiconductor device of claim 1, wherein the controller comprises a temperature reference generator circuit configured to generate the temperature reference signal, wherein the temperature reference generator circuit comprises:
   a plurality of series connected resistors coupled between a voltage supply and a reference node;
   a reference signal node coupled to an intermediate node of the plurality of series connected resistors, wherein the reference signal node is configured to output the temperature reference signal;
   a first bypass switch coupled in parallel with a resistor of the plurality of series connected resistors and configured to be driven in a conducting state when the semiconductor structure temperature exceeds the first predefined threshold; and
   a second bypass switch coupled in parallel with a resistor of the plurality of series connected resistors and configured to be driven in a conducting state when the temperature difference exceeds the second predefined threshold.

8. An integrated circuit comprising:
   a semiconductor structure;
   a first temperature sensor located at a hot spot of the semiconductor structure;
   a second temperature sensor located at a cold spot of the semiconductor structure; and
   a control block configured to
      generate a temperature reference signal,
      cut off current flow through the semiconductor structure when a temperature at the hot spot exceeds a first predefined threshold as indicated by a comparison with the temperature reference signal,
      cut off current flow through the semiconductor structure when a temperature difference between the temperature at the hot spot and a temperature at the cold spot exceeds a second predefined threshold as indicated by a comparison with the temperature reference signal,
      adjust the temperature reference signal when the temperature at the hot spot exceeds the first predefined threshold, and
      adjust the temperature reference signal when the temperature difference exceeds the second predefined threshold.

9. The integrated circuit of claim 8, wherein the semiconductor structure comprises a transistor or a diode or an IGBT.

10. The integrated circuit of claim 8, further comprising a current limiter configured to control the current flowing through the semiconductor structure.

11. The integrated circuit of claim 10, wherein the control block comprises a logic and drive block communicatively coupled to the current limiter and coupled to the semiconductor structure.

12. The integrated circuit of claim 8, wherein the semiconductor structure comprises a power MOSFET.

13. The integrated circuit of claim 8, wherein the circuit is configured to switch off a load coupled to the semiconductor structure.

14. The integrated circuit of claim 8, wherein the control block comprises a temperature reference generator circuit configured to generate the temperature reference signal, wherein the temperature reference generator circuit comprises:
   a plurality of series connected resistors coupled between a voltage supply and a reference node;
   a reference signal node coupled to an intermediate node of the plurality of series connected resistors, wherein the reference signal node is configured to output the temperature reference signal;
   a first bypass switch coupled in parallel with a resistor of the plurality of series connected resistors and configured to be driven in a conducting state the temperature at the hot spot exceeds the first predefined threshold; and
   a second bypass switch coupled in parallel with a resistor of the plurality of series connected resistors and configured to be driven in a conducting state when the temperature difference exceeds the second predefined threshold.

15. A method for controlling a semiconductor structure, the method comprising:
   sensing a temperature at a cold spot of the semiconductor structure;
   sensing a temperature at a hot spot of the semiconductor structure;
   determining a temperature difference between the temperature at the cold spot and the temperature at the hot spot of the semiconductor structure;
   generating a temperature difference signal;

cutting off a current flow through the semiconductor structure when the temperature difference signal exceeds a temperature reference signal, wherein the temperature reference signal is based on a maximum temperature threshold and a difference temperature threshold; and adjusting the temperature reference signal when the temperature at the hot spot exceeds the maximum temperature threshold or when the temperature difference exceeds the difference temperature threshold.

16. The method of claim 15 wherein the semiconductor structure comprises a transistor and a diode or an IGBT.

17. The method of claim 15, further comprising controlling a current limiter to control the current flowing through the semiconductor structure.

18. The method of claim 17, comprising controlling the current limiter and the semiconductor structure by a logic and drive block.

19. The method of claim 15, wherein the semiconductor structure comprises a power MOSFET.

20. The method of claim 15, wherein the semiconductor structure is coupled to an inductive load.

21. The method of claim 15, wherein cutting off the current flow comprises cutting of the current flow through the semiconductor structure when a temperature at a gate or at a source of the semiconductor structure exceeds a predefined first threshold value or when the temperature difference exceeds a second predefined threshold value.

22. The method of claim 15, wherein generating the temperature difference signal comprises:

dividing a supply voltage across a plurality of series connected resistors;

tapping an intermediate node of the plurality of series connected resistors in order to generate the reference signal;

bypassing a resistor of the plurality of series connected resistors when the temperature at the hot spot exceeds the maximum temperature threshold; and bypassing a resistor of the plurality of series connected resistors when the temperature difference exceeds the difference temperature threshold.

* * * * *